United States Patent

Kawai et al.

[11] Patent Number: 6,137,263
[45] Date of Patent: Oct. 24, 2000

[54] METHOD AND DEVICE FOR CHECKING BATTERY CHARGE

[75] Inventors: Toshiyuki Kawai, Okazaki; Hidetoshi Kato, Suzuka; Tetsuya Kobayashi, Anjo; Takashi Yamashita, Kariya, all of Japan

[73] Assignees: Nippon Soken, Inc., Nishio; DENSO Corporation, Kariya, both of Japan

[21] Appl. No.: 09/275,419

[22] Filed: Mar. 24, 1999

[30] Foreign Application Priority Data

Apr. 3, 1998 [JP] Japan .................................. 10-091835
Aug. 24, 1998 [JP] Japan .................................. 10-237569

[51] Int. Cl.[7] .......................... H01M 10/44; H01M 10/46
[52] U.S. Cl. ............................................................ 320/132
[58] Field of Search .................................. 320/132, 148, 320/150, 151, 161, FOR 138, DIG. 21

[56] References Cited

U.S. PATENT DOCUMENTS 5,187,425  2/1993  Tanikawa .
5,489,836  2/1996  Yuen .
5,497,068  3/1996  Shiojima .
5,519,303  5/1996  Goedken et al. .
5,563,496  10/1996  McClure .

FOREIGN PATENT DOCUMENTS 6-290816  10/1994  Japan .
8-2149   1/1996  Japan .
8-140283  5/1996  Japan .

*Primary Examiner*—Edward H. Tso
*Attorney, Agent, or Firm*—Pillsbury Madison & Sutro LLP

[57] ABSTRACT

A method and device for determining whether a battery for a hybrid vehicle is fully charged includes: detecting the battery current, providing a unit of stored battery energy, detecting Joule heat loss and battery temperature, calculating changes in the battery Joule heat loss and battery temperature while the battery is charged by the unit of stored energy and a ratio between the Joule heat loss and temperature changes, and comparing the ratio of the Joule heat loss and temperature changes with a predetermined level.

8 Claims, 9 Drawing Sheets

METHOD AND DEVICE FOR CHECKING BATTERY CHARGE

CROSS REFERENCE TO RELATED APPLICATION

The present application claims priority from Japanese Patent Applications Hei 10-91835 filed on Apr. 3, 1998 and Hei 10-237569 filed on Aug. 24, 1998, the contents of which are incorporated herein by reference.

BACKGROUND OF THE INVENTION

1. Field of the invention

The present invention relates to a battery checking method and battery checking device using the same, particularly, a method and a device for checking whether a battery is fully charged or not.

2. Description of the Related Art

Recently, various rechargeable batteries such as lead-acid battery, nickel-metal hydride (Ni-MH) battery and the like have been used for electric vehicles, and it has become important to determine whether such batteries are fully charged or not. Usually, the battery's full charge is determined according to the following conditions:

1) when a rate of temperature change dT/dt becomes a threshold level as disclosed in JP-A-6-290816, 2) when a rate of voltage change dV/dt becomes a threshold level, 3) when the battery terminal voltage becomes a threshold level as disclosed in JP-A-8-140283, or 4) when a difference between battery temperature and outside temperature becomes a threshold level as disclosed in JP-A-6-290816.

However, the rate of temperature change dT/dt and the rate of voltage change dV/dt change easily if the charging current or type of the charging circuit changes. The battery terminal voltage changes significantly with types and variations of batteries. The difference between the battery temperature and the outside temperature also changes if the outside temperature changes considerably. Thus, it is difficult to determine the battery's full charge accurately by one of the above-stated methods.

SUMMARY OF THE INVENTION

A main object of the invention is to provide an improved method of accurately determining the full charge condition of a battery.

According to a main feature of the invention, a method of checking a battery comprising detecting battery current, providing a unit of stored battery energy, detecting one of the physical amounts of battery conditions, such as battery Joule-heat-loss, battery voltage and battery temperature, calculating a change rate of one of the physical amounts of battery conditions while the battery is charged by the unit of stored energy, and comparing the change rate with a level to determine whether the battery is fully charged.

In a method of the invention, the change rate can be represented by a temperature change rate, and the level can be represented by Joule-heat-loss change. The battery can be determined to be fully charged if a ratio of the temperature change to the Joule-heat-loss change is equal to or higher than a predetermined level. The change can be represented by a battery voltage change, and the level can be represented by a peak level of the battery voltage change level.

Another object of the invention is to provide an improved battery checking device that can accurately determine whether a battery is fully charged.

According to a feature of the invention, a battery checking device comprises first means for detecting battery current, second means for providing a unit of stored battery energy, third means for detecting one of physical amounts including battery Joule-heat-loss, battery voltage and battery temperature, fourth means for calculating a change rate of the detected physical amount while the battery is charged by the unit of stored battery energy, and fifth means for comparing the change rate with a threshold level to determine whether the battery is fully charged.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Figure 1:
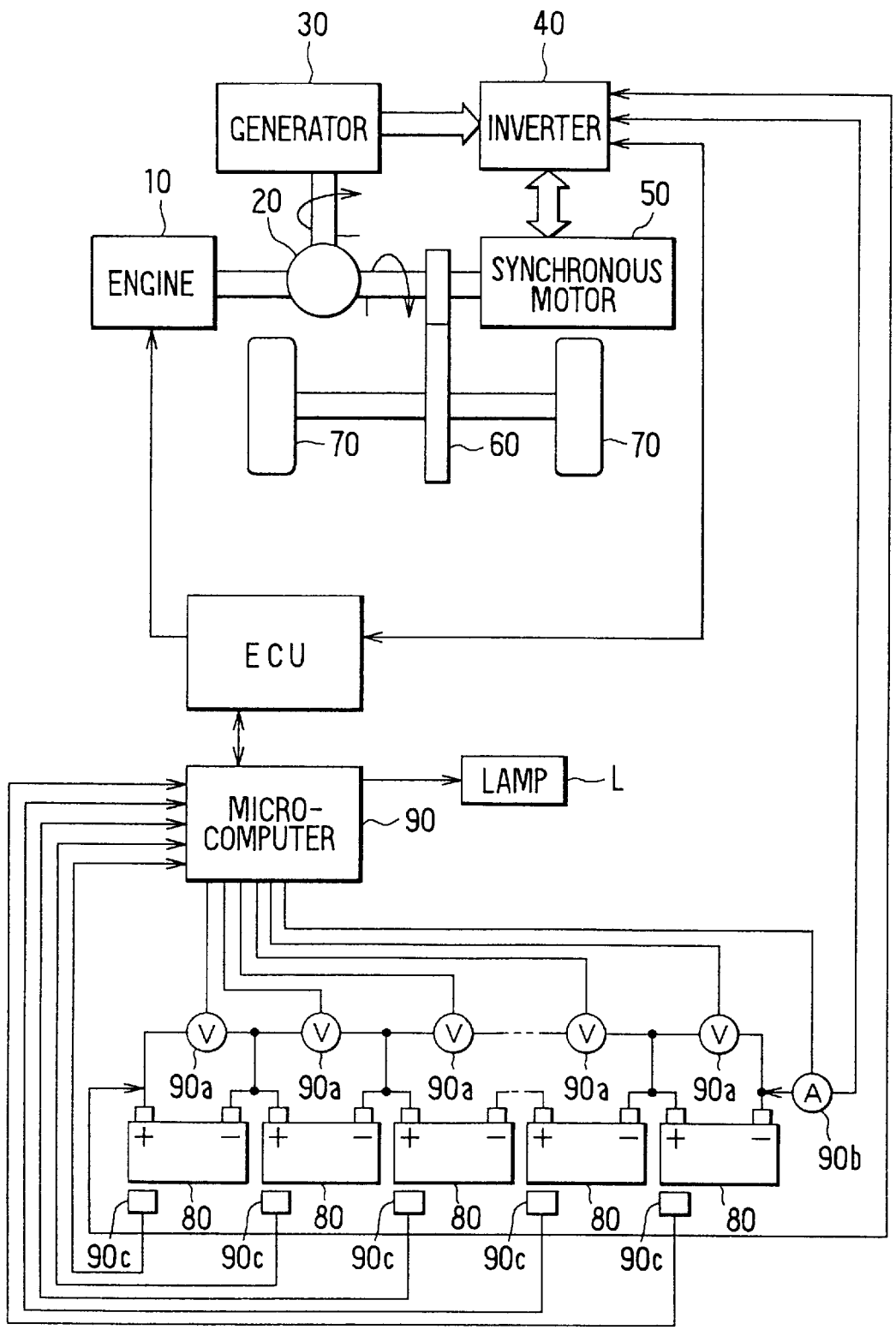
FIG. 1 is a block diagram of a battery charging system and a battery checking device according to a first embodiment of the invention.

A method of checking a plurality of batteries mounted in a hybrid powered vehicle according to a first embodiment of the invention is described with reference to FIGS. 1–9. The hybrid powered vehicle is mainly driven by an engine, and is temporarily driven by a battery-driven motor when a high power is necessary. The battery is charged while the vehicle is driven by the engine.

The hybrid powdered vehicle has engine 10, power distributor 20, generator 30, inverter 40, permanent magnet type synchronous motor 50, gear train 60, wheels 70, a plurality of series connected Ni-MH type batteries 80, microcomputer 90 and an electronic control unit (ECU) connected to microcomputer 90. ECU controls power distributor 20 to share driving power of engine 10 to drive generator 30 and to drive wheels 70 through gear train 60 at a distribution ratio so that engine 10 can generate its power at a maximum efficiency. Generator 30 generates electric power to drive synchronous motor 50 through inverter 40.

When the vehicle is accelerated or runs at a heavy load, synchronous motor 50 is powered through inverter 40 by a plurality of batteries 80 to assist engine 10 to drive wheels 70 at the maximum efficiency of engine 10.

When the vehicle is decelerated, synchronous motor 50 is driven by wheels 70 through gear train 60 to generate electric energy. The electric energy is charged to the plurality of batteries 80 through inverter 40. Thus driving power is converted to electric energy. If the electric energy stored in the plurality of batteries 80 decreases, ECU controls engine 10 running at a light load to increase the driving power so that generator 30 can charge the plurality of batteries 80 through inverter 40.

Microcomputer 90 executes computer programs stored in a ROM according to the flow diagrams shown in FIGS. 2–5. Microcomputer 90 determines whether the plurality of batteries 80 are fully charged or not and actuates lamp L according to the output signals of a plurality of voltage meter 90a, a plurality of ampere meters 90b and a plurality of temperature sensors 90c.

The number of the plurality of voltage meters 90a and the plurality of temperature sensors 90c can be reduced if characteristics of respective batteries 80 do not vary much.

Figure 2:
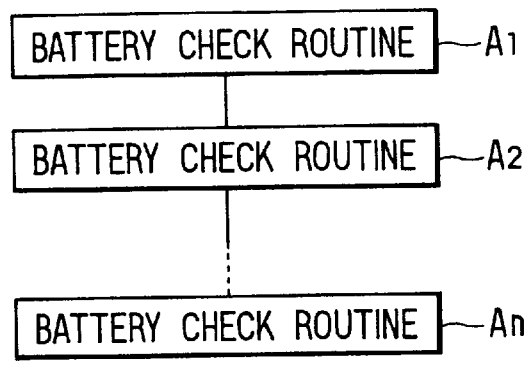
FIG. 2 is a flow diagram of operation of the battery checking device illustrated in FIG. 1.
Figure 3:
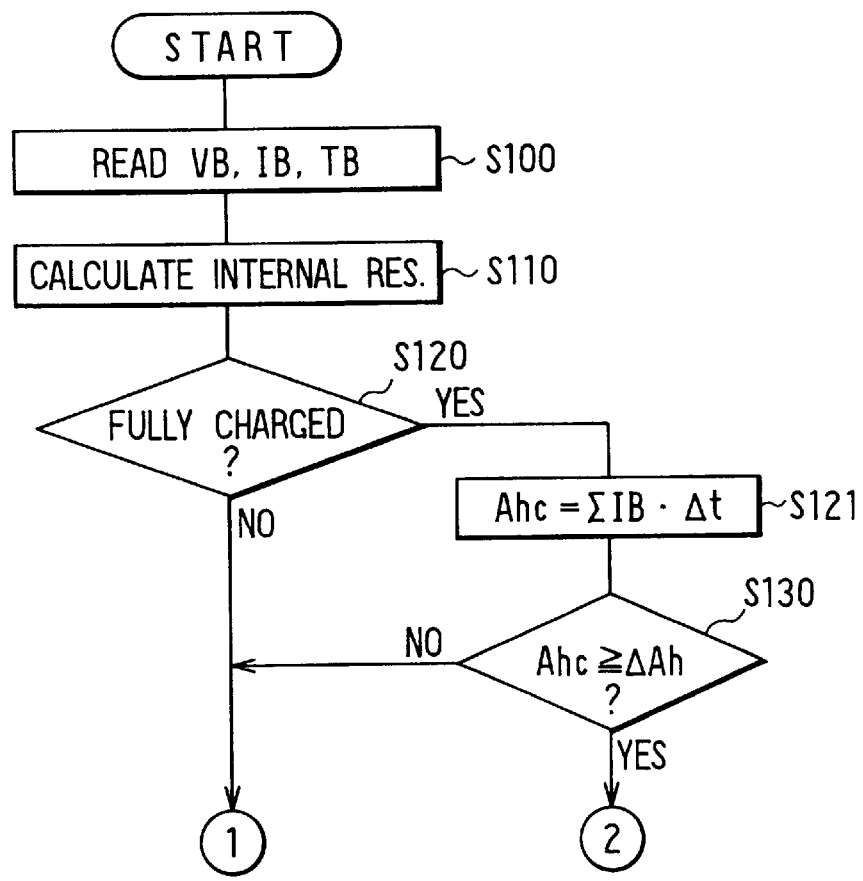
FIG. 3 is the first half flow diagram of a routine of the battery checking device according to the first embodiment.
Figure 4:
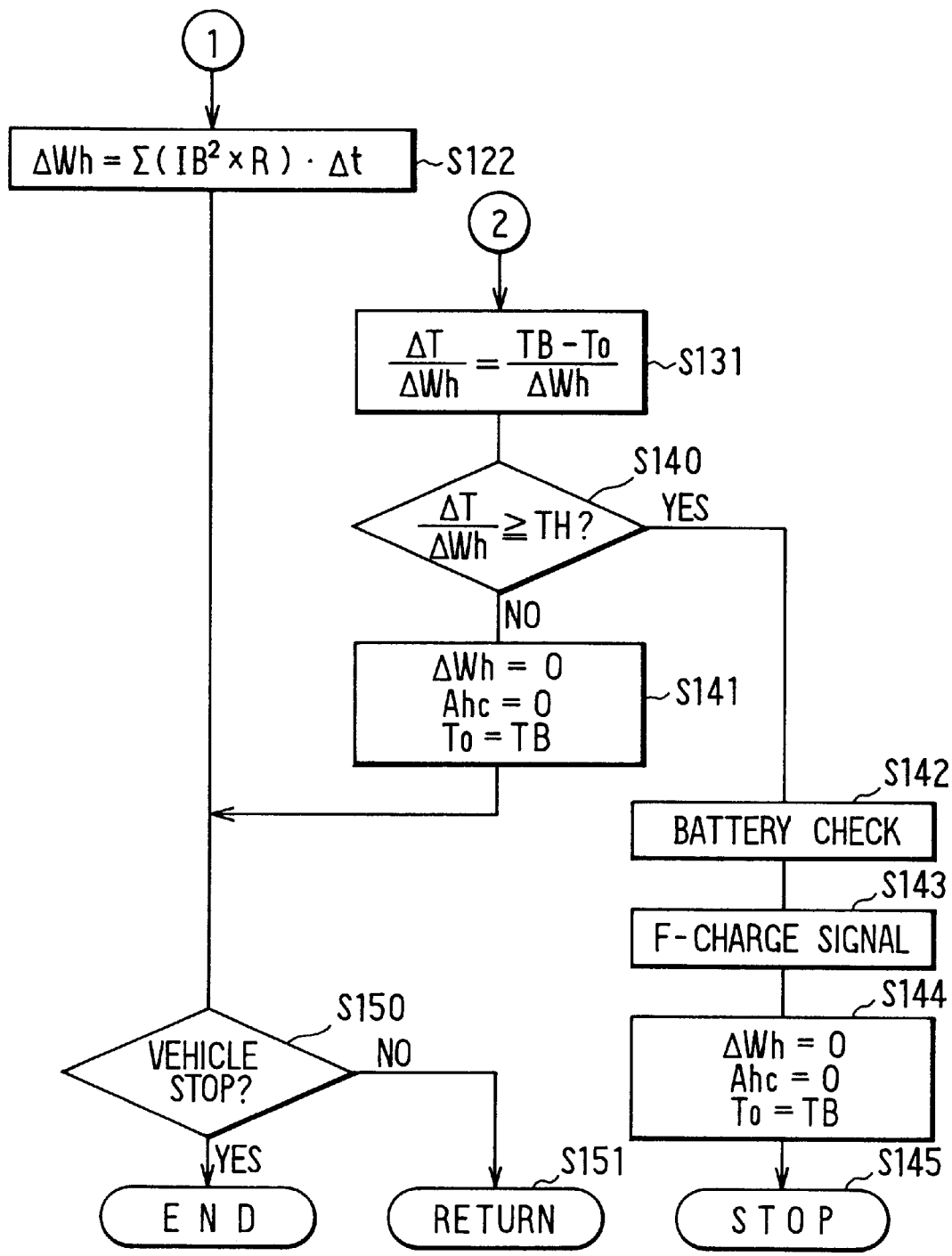
FIG. 4 is the second half flow diagram of the routine.
Figure 5:
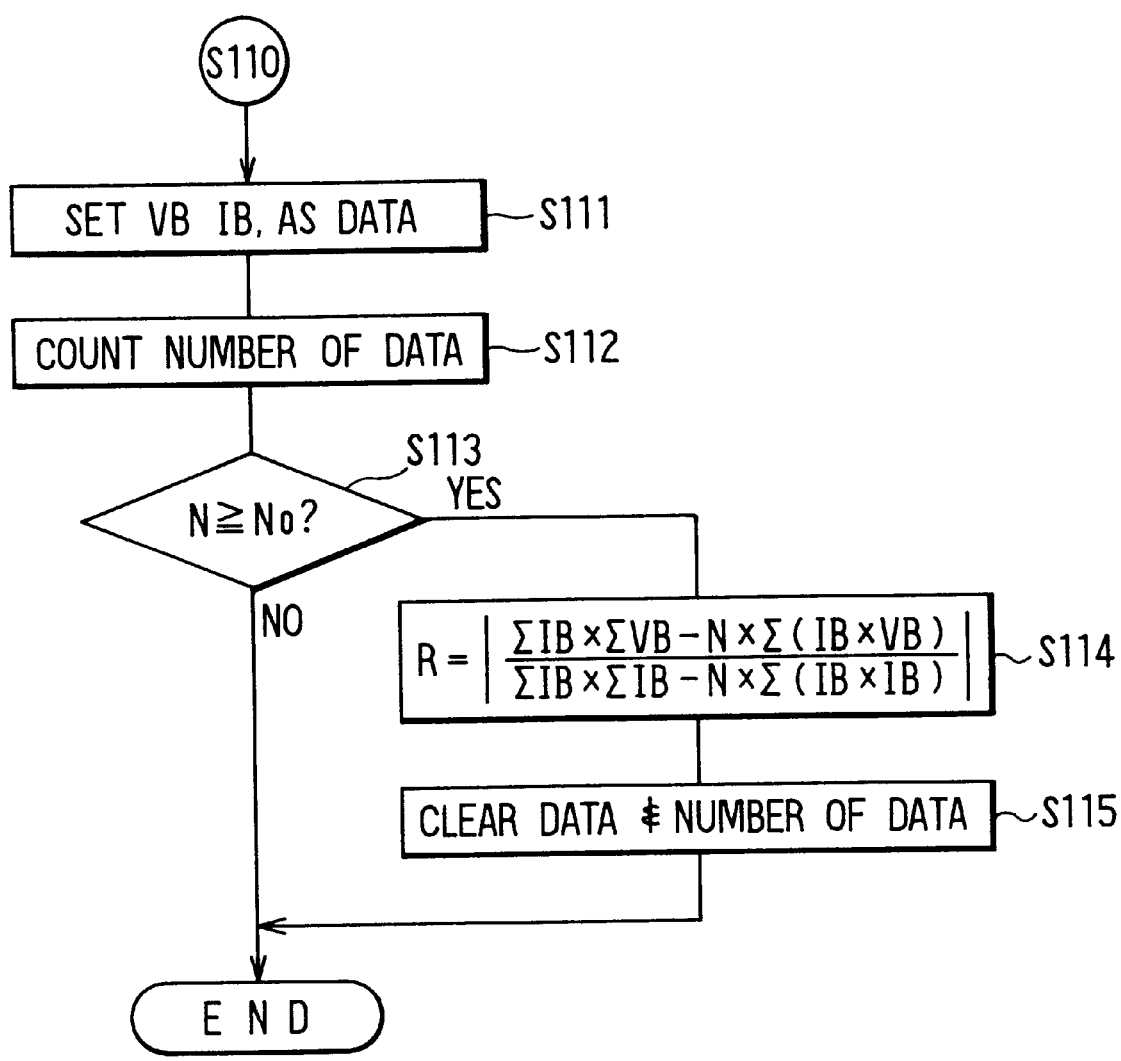
FIG. 5 is a flow diagram of an internal resistance detecting routine of the battery checking device according to the first embodiment.

Microcomputer 90 starts executing the program according to the flow diagram shown in FIG. 2 when the ignition switch of a vehicle is turned on.

In battery check routine A1, the leftmost battery 80 in FIG. 1 is checked to determine whether it is fully charged. In subroutine step S100, terminal voltage signal VB of the leftmost voltage meter 90a, battery current signal IB of the leftmost ammeter 90b and battery temperature TB of the leftmost temperature sensor 90c shown in FIG. 1 are sampled repeatedly and the results are sent to microcomputer 90. Subsequently, the program proceeds to subroutine step S110 shown in FIG. 5 to calculate the battery internal resistance. In step S111, terminal voltage VB and battery current IB are read as a data set. In step S112, number N of the data sets is counted. Then, in step S113, it is determined whether number N is equal to or larger than predetermined number $N_0$. Predetermined number $N_0$ corresponds to a period in which a change in the battery-stored energy is negligibly small. Number $N_0$ can be substituted by such a period. In this embodiment, number $N_0$ corresponds to a number of the data sets collected in 150 seconds, although the set period is not limited.

In step S114, the internal resistance R of the leftmost battery 80 is calculated.

Figure 6:
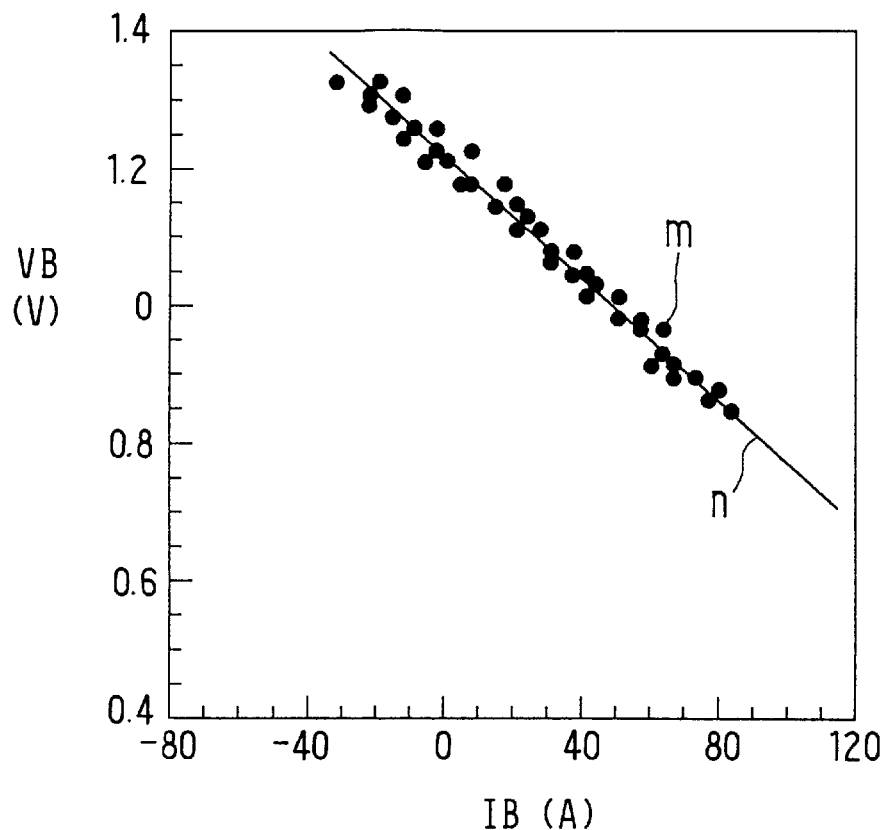
FIG. 6 is a graph showing the relationship between battery voltage and battery charging current.

As shown in FIG. 6, each of a plurality of the data sets, such as set m, is plotted in a Voltage-Ampere graph, and straight line n is given from the plotted sets according to the least square method. The internal resistance R is given in the following expression E1 as the coefficient of the straight line n.

$$R=[[\Sigma IB \times \Sigma VB - N \times \Sigma (IB \times VB)]/[\Sigma IB \times \Sigma IB - N \times \Sigma (IB \times IB)]] \qquad E1$$

In step S115, the plurality of the data sets having been used for calculating the internal resistance R is cleared to renew the internal resistance R. Thus, subroutine S110 ends. If NO is determined in step S113, subroutine S110 also ends.

After subroutine S110 ends, it is determined whether the leftmost battery 80 is charged in step S120. If YES is determined in step S120, battery stored energy Ahc is calculated according to the following expression E2 until Ahc equals unit stored energy ΔAh:

$$Ahc=\Sigma IB \cdot \Delta t \qquad E2$$

Figure 7:
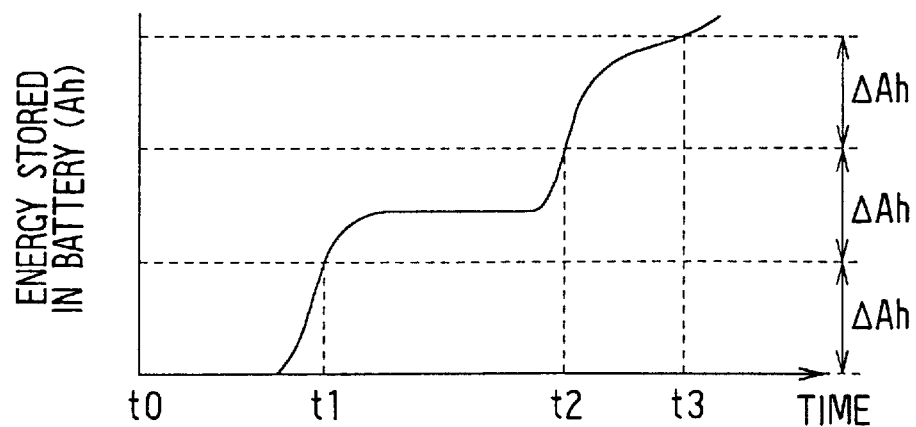
FIG. 7 is a graph showing the relationship between energy stored in battery and time.

Unit stored energy ΔAh is about 1–10% of a rated ampere hour (Ah) of battery 80. For example, the unit stored energy ΔAh for a 6.5-Ah-rated battery can be 0.2 Ah. An amount of the stored energy of the battery can be expressed by stored energy ΔAh as illustrated in FIG. 7.

If NO is determined in step S120, Joule heat loss ΔWh per unit stored energy ΔAh is calculated in step S122 according to the following expression E3.

$$\Delta Wh=\Sigma(IB^2 \times R) \cdot \Delta t \qquad E3$$

In step S130, YES is determined if Ahc is equal to or larger than unit stored energy ΔAh.

According to test results, it is found that a parameter ΔT/ΔWh is very effective to determine whether a battery is fully charged or not. Here, ΔT is a temperature change or a temperature rise when the battery is charged by the unit stored energy ΔAh, and ΔWh is a Joule heat loss change or an amount of Joule heat loss when the battery is charged with the unit stored energy ΔAh.

Figure 8:
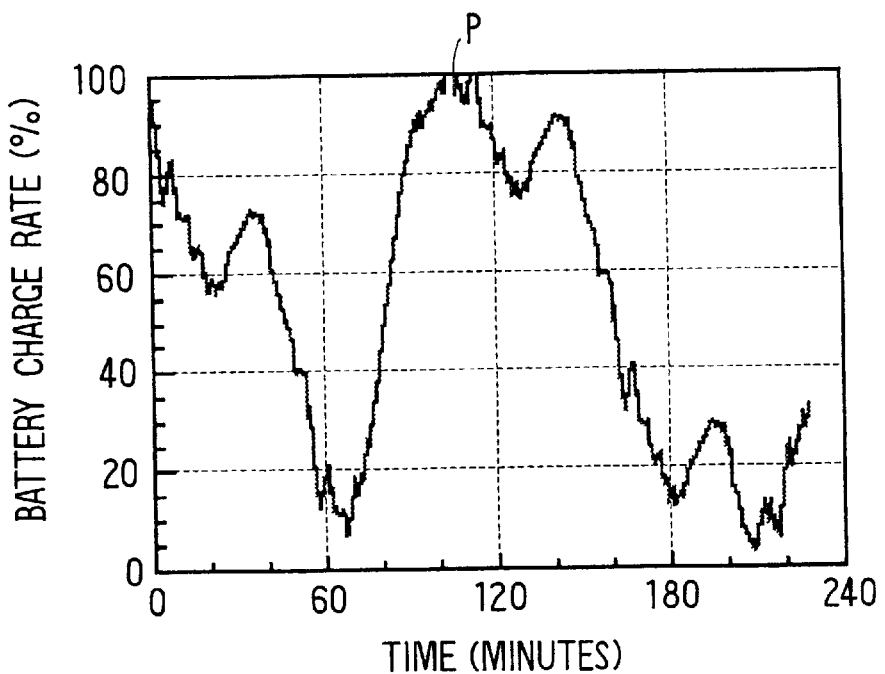
FIG. 8 is a graph showing the relationship between the battery charge rate and vehicle running time.
Figure 9:
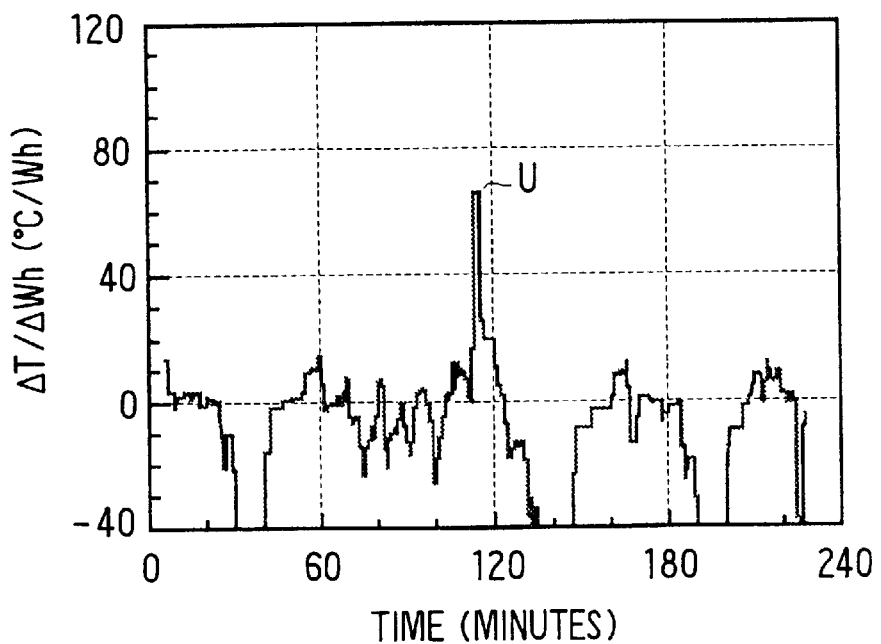
FIG. 9 is a graph showing the relationship between a parameter $\Delta T/\Delta Wh$ and vehicle running time.

In FIG. 8, P indicates that a plurality of Ni-MH batteries is fully charged when a vehicle has run for about 110 minutes. In this test, the plurality of batteries were fully charged before the vehicle had started. In FIG. 9, U indicates that a parameter ΔT/ΔWh is larger than a threshold level TH, such as 60 (° C./Wh), when the vehicle has run for about 110 minutes.

Parameter ΔT/ΔWh is calculated in step S131 according to the following expression E4:

$$\Delta T/\Delta Wh=(TB-T_0)/\Delta Wh,$$

wherein TB indicates a temperature of battery 80 detected this time, $T_0$ indicates a battery temperature detected last time.

In step S140 it is determined, whether the parameter ΔT/ΔWh is equal to or larger than a threshold value TH. If the result is YES, it is determined that the leftmost battery 80 is fully charged.

Threshold value TH is determined according to a test result and various conditions of the battery such as heat capacity of a casing, a cooling system therefor or the like.

Thus, the temperature rise of the battery due to the overcharging can be distinguished from the temperature rise due to the Joule heat loss accurately by setting the threshold value TH.

In step S143, a battery full charge signal is provided to energize lamp L. Consequently, ECU controls engine 10 and inverter 40 in the manner described above. In step S144, ΔWh and Ahc are cleared to 0, and $T_0$ is renewed to TB. In the subsequent step S145, microcomputer 90 stops to carry out the program. This ensures the leftmost battery in good condition.

If the result in step S140 is NO, both ΔWh and Ahc are cleared to 0, and $T_0$ is renewed to TB in step S141. Then, whether the vehicle stops or not is examined in step S150. If YES is determined, the computer stops.

On the other hand, if NO is determined, the computer program proceeds to routine A2 for the battery next to the leftmost battery 80, so that it can be determined whether the next battery 80 is fully charged or not in the same manner as described above.

If the next battery 80 is determined to be not fully charged, the program proceeds to routines A3. Thus routines A4, A5 and so on are executed step by step until the last routine An is executed as far as any one of the batteries 80 is not determined to be fully charged.

The above routines can be applied to any secondary battery such as lead-acid battery, Ni—Cd battery, Li battery or the like. Parameter $\Delta T/\Delta Wh$ described above can be substituted by parameter $\Delta T_{to}/\Delta Wh_{to}$, where $\Delta T_{to}$ is a time change in a unit time and $\Delta Wh_{to}$ is a Joule heat loss in the same unit time.

A method of checking a battery applied to a hybrid powered vehicle according to a second embodiment is described with reference to FIGS. 10–13.

Figure 10:
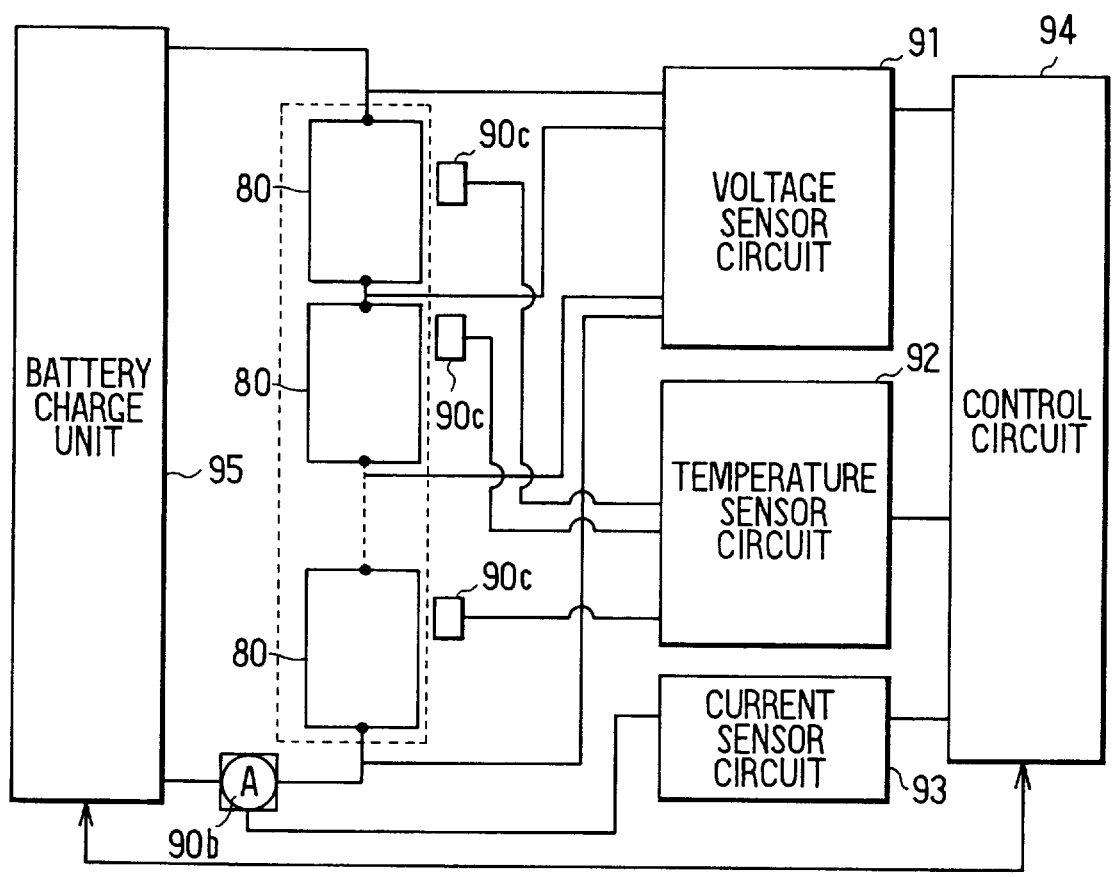
FIG. 10 is a block diagram illustrating a structure of a battery charging system and a battery checking device according to a second embodiment of the invention.

As shown in FIG. 10, a battery charging circuit is composed of a battery assembly of a plurality of batteries 80, current sensor 90b, a plurality of temperature sensors 90c, voltage sensor circuit 91, temperature sensor circuit 92, current sensor circuit 93, control circuit 94, and battery charge unit 95. Voltage sensor circuit 91 converts the battery voltage into digital data and sends the data to control circuit 94 as serial signals. Control circuit 94 includes a microcomputer. Each of the plurality of temperature sensors 90c has temperature sensitive resister energized by temperature sensor circuit 92 and attached to an outer periphery of one of the plurality of batteries 80. The detected temperature is converted into a digital data, which is sent to control circuit 94 as serial signals. The plurality of batteries 80 are charged by battery charge unit 95. Current IB charged to the plurality of batteries 80 is detected by current sensor 90b and converted by current sensor circuit 93 into a digital data, which is sent to control circuit as serial signals.

Figure 11:
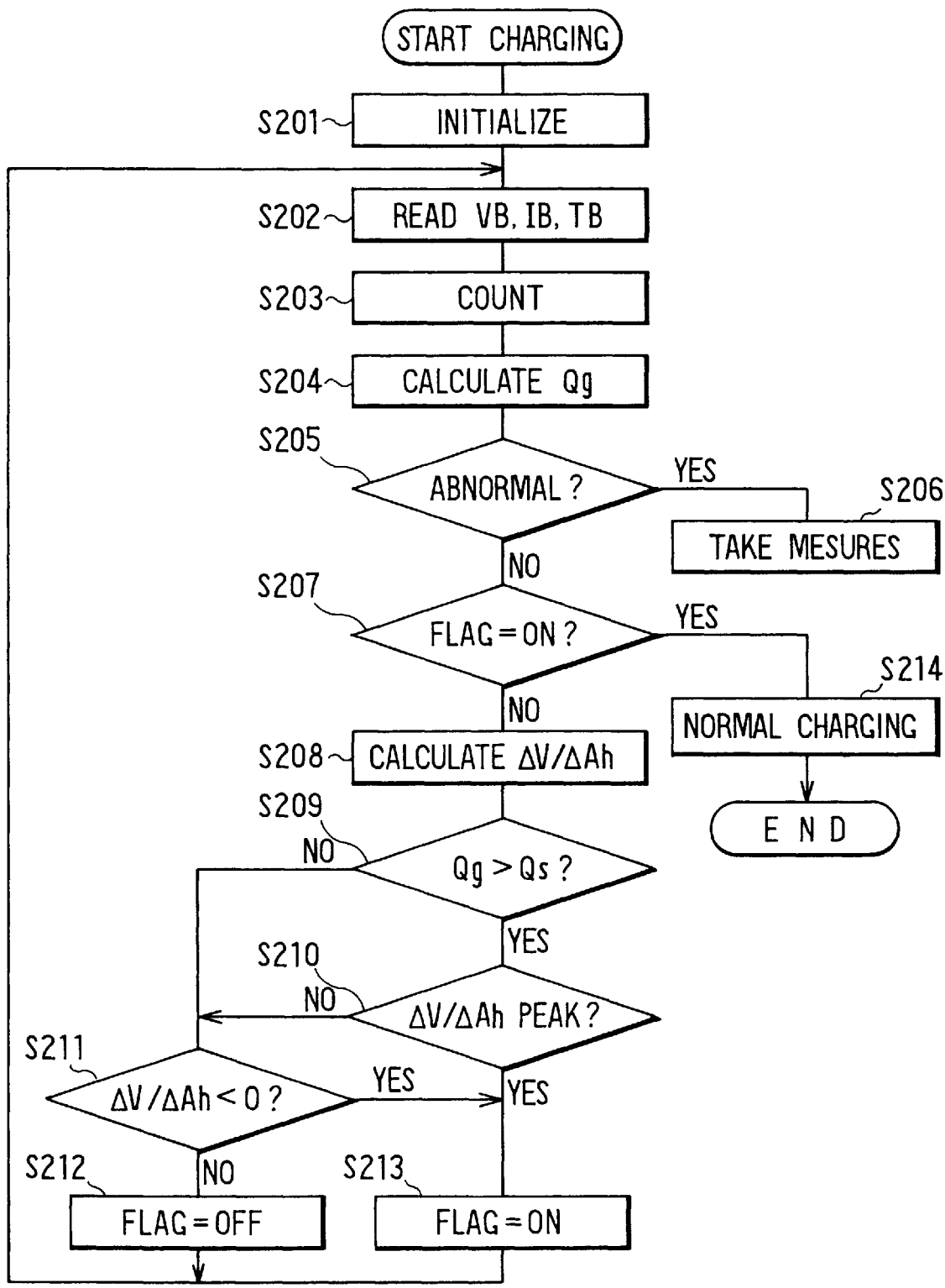
FIG. 11 is a flow diagram of operation of the battery checking device illustrated in FIG. 10.

A charge control routine of control circuit 94 is described with reference to a flow diagram shown in FIG. 11. The charge control routine is started when a charge command signal is applied from outside to control circuit 94 and is, thereafter, repeated at short intervals.

In step S201, control circuit 94 is initialized. Consequently, a charge timer is reset, and a full charge flag is turned off as described below. In step S202, battery terminal voltage VB, battery charge current IB, and battery temperature TB are read. In step S203, the timer is started to count time when batteries 80 are charged. In step S204, battery charge current IB is integrated to provide stored charge or energy Qg. In step S205, whether or not any of the plurality of batteries 80 is abnormal is examined. If it is abnormal or YES is determined, certain abnormality measures are taken in step S206. Otherwise, whether the full charge flag is turned or not is examined in S207. If the result is YES, the charge control routine ends after taking a measure to charge batteries 80 with a small amount of regular current in step S214.

If the result in step S207 is NO, a current value of $\Delta V/\Delta Ah$ is calculated in step S208. Here, $\Delta V/\Delta Ah$ is a ratio of the terminal battery voltage difference $\Delta V$ per a unit stored energy $\Delta Ah$ to be charged to battery 80. The unit stored energy $\Delta Ah$ is 0.01%–3%, preferably, about 1% of a rated capacity of battery 80. The battery voltage difference $\Delta V$ is represented by a difference between average terminal voltage VB detected this time and average terminal voltage VB detected the last time. In step S209, whether or not stored energy Qg of battery 80 is larger than discharged energy Qs is examined. The stored energy Qg is an amount of energy charged since battery 80 is fully charged last time, and the discharged energy Qs is an amount of energy discharged in the same period as the above. If stored energy Qg is larger than discharged energy Qs, YES is determined, and whether or not the value $\Delta V/\Delta Ah$ has reached its peak is examined in step S210. If the last three of the stored values $\Delta V/\Delta Ah$ show a simple decreasing tendency, YES is determined in step S210, and the flag is turned on in step S213 to repeat this control routine from step S202. If NO is determined in step S209 or S210, whether or not $\Delta V/\Delta Ah$ is smaller than zero is examined in step S211.

Figure 12:
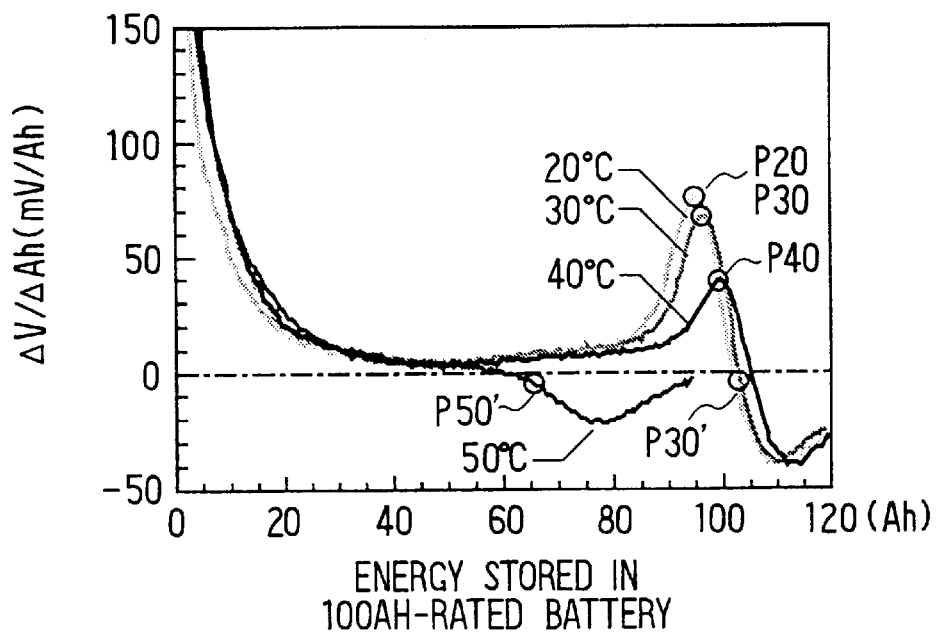
FIG. 12 is a graph showing relationship between $\Delta V/\Delta Ah$ and energy stored in a battery.

Steps S208, 209, 210, and 211 are carried out to determine whether battery 80 is fully charged or not according to the relationship between the battery energy in ampere-hour and $\Delta V/\Delta Ah$. As shown in FIG. 12, characteristic curves of $\Delta V/\Delta Ah$ of a 100-Ah-rated battery under various ambient temperatures have respective positive peak points P20, P30, P40 and sub-zero points P30' at stored energy higher than 100 Ah that is the rated capacity of the battery. The peak point lowers as the ambient temperature increases. The characteristic curve of $\Delta V/\Delta Ah$ under ambient temperature 50° C. has sub-zero point P50' at an amount of energy less than 100 Ah and does not have any positive peak point.

Here, NO in step S209 or Qg<Qs indicates that battery 80 may not be fully charged in normal conditions. If three of the values $\Delta V/\Delta Ah$ stored until the last are less than zero, YES is determined to proceed to step S213. That is, battery 80 is considered to be fully charged although the value $\Delta V/\Delta Ah$ has not reached its peak or Qg is smaller than Qs, as indicated by curve "50° C." in FIG. 12. This curve shows that the battery may be fully charged with stored energy less than the rated battery capacity, for example, 100 Ah. A test result shows that the battery full-charge condition can be checked accurately irrespective of the amount of charging current if the ambient temperature does not change very frequently.

If NO is determined in step S211, the flag is turned off in step S212 to repeat this control routine from step S202.

Figure 13:
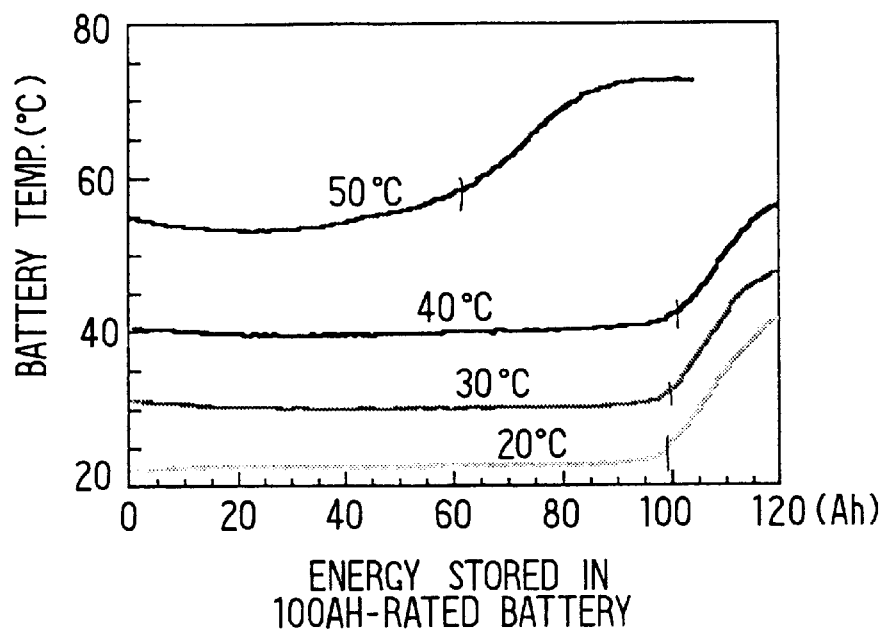
FIG. 13 is a graph showing relationship between battery temperature and energy stored in a battery.

Whether battery 80 is fully charged or not can also be determined according to the relationship between the battery temperature change relative to an amount of stored energy of a battery. As shown in FIG. 13, the battery temperature rises significantly as the battery stored energy nears the rated capacity thereof, for example, 100 Ah. Thus, the temperature change $\Delta T/\Delta Ah$ can be effectively applicable to checking of the battery condition.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention is to be regarded in an illustrative, rather than restrictive, sense.

What is claimed is:

1. A method of checking a battery comprising:

detecting battery current;

providing a unit of stored battery energy;

detecting battery Joule heat loss and battery temperature;

calculating changes in said battery Joule heat loss and said battery temperature while the battery is charged by said unit of stored battery energy and a ratio between said changes; and comparing said ratio with a predetermined level to determine whether said battery is fully charged.

2. The method as claimed in claim 1, wherein said battery is determined to be fully charged if said ratio is a ratio of said temperature change to said Joule-heat-loss change that is equal to or higher than a predetermined level.

3. The method according to claim 1, further comprising:

detecting a battery voltage, wherein said battery Joule-heat-loss is calculated from said battery current and said battery voltage.

4. A method of checking a battery comprising the steps of:

detecting battery current;

detecting battery Joule-heat-loss;

calculating a change rate of said battery Joule-heat-loss while said battery is charged in a unit of time; and comparing said change rate with a predetermined level to determine whether said battery is fully charged.

5. A method of checking a plurality of batteries comprising:

(a) detecting battery current of a first of said plurality of batteries;

(b) providing a unit of stored battery energy;

(c) detecting battery Joule-heat-loss and battery temperature;

(d) calculating a ratio of a change in said battery temperature to a change in said battery-Joule-heat-loss while the first of said plurality of batteries is charged by said unit of stored energy;

(e) comparing said ratio with a level to determine whether said battery is fully charged, (f) detecting battery current of the next battery of said plurality of batteries to determine whether said battery is fully charged;

(g) detecting battery Joule-heat-loss and battery temperature of said next battery;

(h) calculating a next ratio of a change in said battery temperature to a change in said battery Joule-heat-loss while said next battery is charged by said unit of stored energy;

(i) comparing said next ratio with a level to determine whether said next battery is fully charged; and (j) repeating (f), (g), (h), and (i) until said next battery is determined to be fully charged.

6. A method of checking a plurality of batteries mounted in a hybrid vehicle comprising:

(a) detecting Joule heat loss $\Delta Wh$ of one of said plurality of batteries;

(b) detecting a temperature change $\Delta T$ of one of said plurality of batteries;

(c) calculating a ratio $\Delta T/\Delta Wh$ of said one of said plurality of batteries;

(d) comparing said ratio $\Delta T/\Delta Wh$ with a reference level TH to determine that said battery is fully charged if said ratio is equal to or larger than said threshold level; and (e) repeat (a), (b), (c) and (d) each for subsequent battery of said plurality of batteries if said ratio of said subsequent one of said plurality of batteries is less than said threshold level.

7. A battery checking device for a battery comprising:

first means for detecting battery current;

second means for providing a unit of stored battery energy;

third means for detecting battery Joule-heat-loss and battery temperature;

fourth means for calculating a ratio of a change in said battery temperature to a change in said battery Joule-heat-loss while said battery is charged by said unit of stored battery energy; and fifth means for comparing said with a threshold level to determine whether said battery is fully charged.

8. A battery checking device for a battery comprising:

first means for detecting battery current;

second means for detecting battery Joule-heat-loss;

third means for calculating a change rate of said battery Joule-heat-loss while said battery is charged in a unit of time; and fourth means for comparing said change rate with a predetermined level to determine whether said battery is fully charged.

* * * * *